US008426883B2

(12) United States Patent
Park et al.

(10) Patent No.: US 8,426,883 B2
(45) Date of Patent: Apr. 23, 2013

(54) LIGHT EMITTING DEVICE, METHOD OF MANUFACTURING THE LIGHT EMITTING DEVICE, LIGHT EMITTING DEVICE PACKAGE, AND LIGHTING UNIT

(75) Inventors: Kyung Wook Park, Seoul (KR); Myung Hoon Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 44 days.

(21) Appl. No.: 13/033,745

(22) Filed: Feb. 24, 2011

(65) Prior Publication Data
US 2011/0210359 A1 Sep. 1, 2011

(30) Foreign Application Priority Data

Apr. 28, 2010 (KR) ........................ 10-2010-0039397

(51) Int. Cl.
*H01L 33/00* (2010.01)
(52) U.S. Cl.
USPC ............... 257/98; 257/99; 257/100; 257/183; 257/184; 257/189; 257/200; 257/201; 257/257
(58) Field of Classification Search ............ 257/79–103, 257/183–184, 200, 201, 257
See application file for complete search history.

(56) References Cited

U.S. PATENT DOCUMENTS

| 7,049,635 B2* | 5/2006 | Sano et al. ........................ 257/79 |
| 7,265,392 B2* | 9/2007 | Hahn et al. ........................ 257/99 |
| 7,928,464 B2* | 4/2011 | Lee et al. ........................ 257/99 |
| 2003/0003225 A1 | 1/2003 | Choi et al. |
| 2007/0145391 A1 | 6/2007 | Baik et al. |
| 2008/0023691 A1* | 1/2008 | Jang et al. ........................ 257/13 |
| 2010/0090237 A1 | 4/2010 | Jeong |
| 2010/0123149 A1* | 5/2010 | Bae ................................ 257/94 |

FOREIGN PATENT DOCUMENTS

| JP | 2005-252086 A | 9/2005 |
| KR | 10-0258720 B1 | 3/2000 |
| KR | 10-2005-0070459 A | 7/2005 |
| KR | 10-0661159 B1 | 12/2006 |
| KR | 10-2007-0060973 A | 6/2007 |
| KR | 10-2010-0020666 A | 2/2010 |

* cited by examiner

*Primary Examiner* — Steven Loke
*Assistant Examiner* — Cuong Nguyen
(74) *Attorney, Agent, or Firm* — McKenna Long & Aldridge LLP (57) ABSTRACT

Provided are a light emitting device, a method for fabricating the light emitting device, a light emitting device package, and a lighting unit. The light emitting device includes a conductive support substrate, a protection layer on the conductive support substrate, the protection layer having an inclined top surface, a light emitting structure layer including a first conductive type semiconductor layer, a second conductive type semiconductor layer, and an active layer between the first conductive type semiconductor layer and the second conductive type semiconductor layer on the conductive support substrate and the protection layer, and an electrode on the light emitting structure layer. A portion of the protection layer is disposed between the conductive support substrate and the light emitting structure layer.

20 Claims, 9 Drawing Sheets

LIGHT EMITTING DEVICE, METHOD OF MANUFACTURING THE LIGHT EMITTING DEVICE, LIGHT EMITTING DEVICE PACKAGE, AND LIGHTING UNIT

CROSS-REFERENCE TO RELATED APPLICATIONS

The present application claims priority of Korean Patent Application No. 10-2010-0039397 filed on Apr. 28, 2010, which is hereby incorporated by reference in its entirety as if fully set forth herein.

BACKGROUND OF THE INVENTION

Embodiments relate to a light emitting device, a method of manufacturing the light emitting device, a light emitting device package, and a lighting unit.

A light emitting diode (LED) is a kind of a semiconductor device for converting electric energy into light. The LED has advantages such as low power consumption, a semi-permanent life cycle, a fast response time, safety, and environment friendly compared to the related art light source such as a fluorescent lamp and an incandescent bulb. Many studies are being in progress in order to replace the related art light source with an LED. Also, the LED is being increasingly used according to the trend as light sources of a lighting device such as a variety of lamps and streetlights, a lighting unit of a liquid crystal display device, and a scoreboard in indoor and outdoor places.

SUMMARY OF THE INVENTION

Embodiments provide a light emitting device having a new structure, a method of manufacturing the light emitting device, a light emitting device package, and a lighting unit.

Embodiments also provide a light emitting device in which dislocation of a light emitting structure layer is reduced, a method of manufacturing the light emitting device, a light emitting device package, and a lighting unit.

Embodiments also provide a light emitting device a light emitting device in which a stress due to a thermal expansion coefficient difference is reduced, a method of manufacturing the light emitting device, a light emitting device package, and a lighting unit.

Embodiments also provide a light emitting device a light emitting device in which a stress of a light emitting structure layer generated in a laser lift off process is reduced, a method of manufacturing the light emitting device, a light emitting device package, and a lighting unit.

In one embodiment, a light emitting device includes: a conductive support substrate; a protection layer on the conductive support substrate, the protection layer having an inclined top surface; a light emitting structure layer including a first conductive type semiconductor layer, a second conductive type semiconductor layer, and an active layer between the first conductive type semiconductor layer and the second conductive type semiconductor layer on the conductive support substrate and the protection layer; and an electrode on the light emitting structure layer, wherein a portion of the protection layer is disposed between the conductive support substrate and the light emitting structure layer.

In another embodiment, a light emitting device package includes: a package body; first and second electrode layers on the package body; and a light emitting device electrically connected to the first and second electrode layers, wherein the light emitting device includes: a conductive support substrate; a protection layer on the conductive support substrate, the protection layer having an inclined top surface; a light emitting structure layer including a first conductive type semiconductor layer, a second conductive type semiconductor layer, and an active layer between the first conductive type semiconductor layer and the second conductive type semiconductor layer on the conductive support substrate and the protection layer; and an electrode on the light emitting structure layer, wherein a portion of the protection layer is disposed between the conductive support substrate and the light emitting structure layer.

The details of one or more embodiments are set forth in the accompanying drawings and the description below. Other features will be apparent from the description and drawings, and from the claims.

DETAILED DESCRIPTION OF THE EMBODIMENTS

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

FIGS. 13 to 17 are schematic views illustrating a process of manufacturing a light emitting device according to an embodiment. A method of manufacturing a light emitting device will be described with reference to FIGS. 13 to 17.

Figure 13:
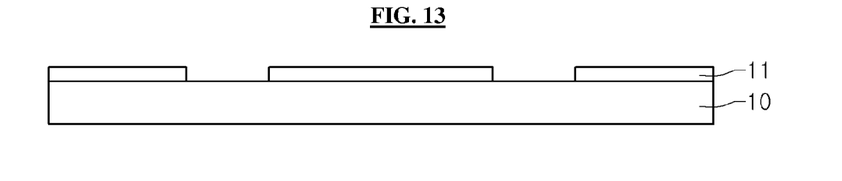
FIGS. 13 to 17 are schematic views illustrating a process of manufacturing a light emitting device according to an embodiment.
Figure 14:
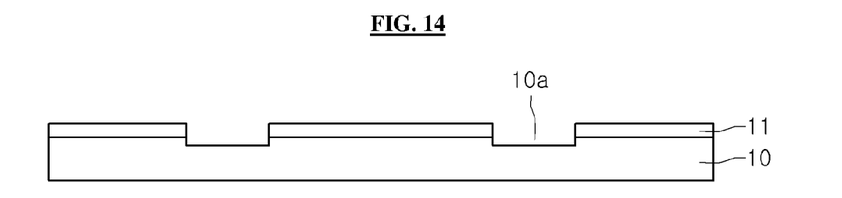

Referring to FIGS. 13 and 14, a photoresist pattern 11 is formed on a substrate 10. The substrate 10 is selectively removed using the photoresist pattern 11 as a mask to form an etch concave portion 10a in the substrate 10. The substrate 10 may be a growth substrate such as a sapphire substrate in which a nitride semiconductor layer can be grown.

Figure 15:
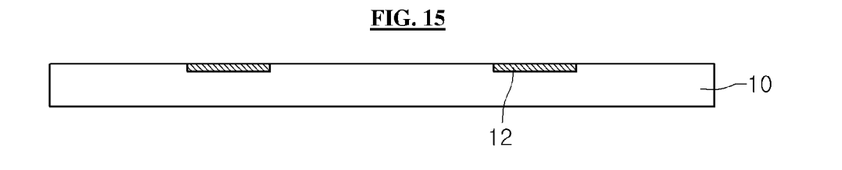

Referring to FIG. 15, a mask layer 12 is formed within the etch concave portion 10a. For example, the mask layer 12 may be formed of a $SiO_2$ material. The nitride semiconductor layer such as a GaN-based semiconductor layer is not well grown on the mask layer 12. The mask layer 12 may partially fill the etch concave portion 10a or completely fill the etch concave portion 10a. After the mask layer 12 is formed, the photoresist pattern 11 is removed.

Figure 16:
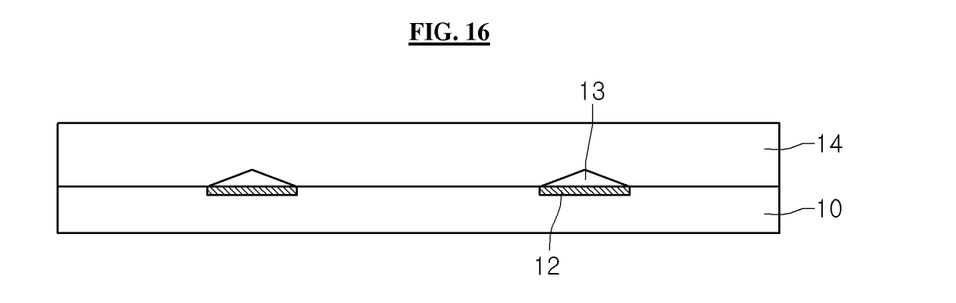

Referring to FIG. 16, a nitride semiconductor layer 14 is grown on the substrate 10. The nitride semiconductor layer 14 may be formed as a light emitting structure layer including an N-type semiconductor layer, an active layer, and a P-type semiconductor layer.

The nitride semiconductor layer 14 is not formed on the mask layer 12. The nitride semiconductor layer 14 is vertically and horizontally grown on the substrate 10 and met with each other at a portion, which is spaced from the mask layer 12 and disposed above the mask layer 12. Thus, a space 13 in which the nitride semiconductor layer 14 does not exist is formed on the mask layer 12.

Since the substrate 10 and the nitride semiconductor layer 14 are partially spaced from each other and partially contacts each other by the mask layer 12, bowing of the substrate 10 and the nitride semiconductor layer 14 may be reduced by a thermal expansion coefficient difference between the substrate 10 and the nitride semiconductor layer 14.

Also, since the nitride semiconductor layer 14 is partially grown on the substrate 10 and met with each other by the mask layer 12, an occurrence of dislocation may be reduced.

Also, when the mask layer 12 has a top surface equal to or lower than that of the substrate 10, the nitride semiconductor layer 14 may be easily met with each other above the mask layer 12.

Figure 17:
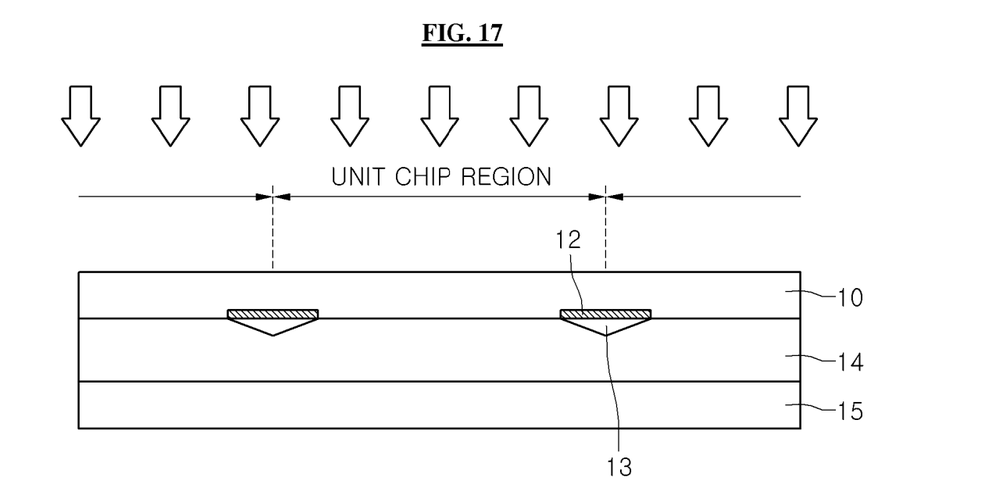

Referring to FIG. 17, a hetero-substrate 15 formed of a material different from that of the substrate 10 is formed on the nitride semiconductor layer 14, and then, a laser lift off process is performed to remove the substrate 10. A conductive substrate may be used as the hetero-substrate 15.

The mask layer 12 is formed on a boundary portion of a unit chip region. Since the laser lift off process is performed for each unit chip region, a laser is overlappingly irradiated at the boundary portion of the unit chip region. Thus, the nitride semiconductor layer 14 may be damaged by the laser at the boundary portion of the unit chip region. In the method of manufacturing the light emitting device according to an embodiment, the mask layer 12 and the space 13 may be formed at the boundary portion of the unit chip region to reduce the damage of the nitride semiconductor layer 14. Also, since the mask layer 12 is spaced from the nitride semiconductor layer 14, but does not contact the nitride semiconductor layer 14, a stress applied to the nitride semiconductor layer 14 in a process in which the substrate 10 and the mask layer 12 are removed may be reduced.

Hereinafter, a light emitting device, a method of manufacturing the light emitting device, and a light emitting device package according to an embodiment will be described in more detail with reference to FIGS. 1 to 12.

Figure 1:
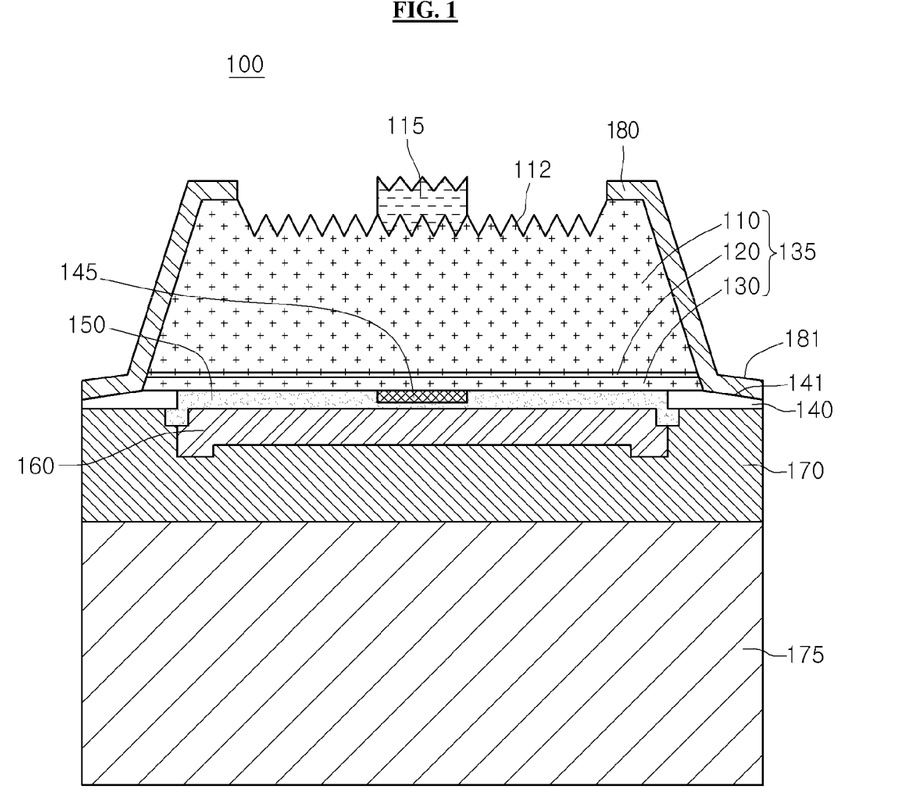
FIG. 1 is a view of a light emitting device according to an embodiment.

FIG. 1 is a view of a light emitting device according to an embodiment.

Referring to FIG. 1, a light emitting device 100 according to an embodiment includes a conductive support substrate 175, an adhesion layer 170 on the conductive support substrate 175, a reflective layer 160 on the adhesion layer 170, an ohmic contact layer 150 on the reflective layer 160, a passivation layer 140 around a top surface of the adhesion layer 170, a light emitting structure layer 135 disposed on the ohmic contact layer 150 and the protection layer 140 to generate light, a passivation layer 180 protecting the light emitting structure layer 135, a current blocking layer 145 between the reflective layer 160 and the light emitting structure layer 135, and an electrode 115 on the light emitting structure layer 135.

The conductive support substrate 175 may support the light emitting structure layer 135. The conductive support substrate 175 together with the electrode 115 provides a power to the light emitting structure layer 135. For example, the conductive support substrate 175 may be formed of at least one of Cu, Au, Ni, Mo, Cu—W, and a carrier wafer (e.g., Si, Ge, GaAs, ZnO, SiC, SiGe, or etc.).

The conductive support substrate 175 has a thickness, which is varied according to a design of the light emitting device 100. For example, the conductive support substrate 175 may have a thickness of about 50 μm to about 300 μm.

The adhesion layer 170 may be disposed on the conductive support substrate 175. The adhesion layer 170 may be a bonding layer and disposed under the reflective layer 160 and the protection layer 140. The adhesion layer 170 may contact the reflective layer 160, the ohmic contact layer 150, and the protection layer 140 to allow the reflective layer 160, the ohmic contact layer 150, and the protection layer 140 to strongly adhere to the conductive support substrate 175.

The adhesion layer 170 may be formed of a barrier metal or bonding metal, e.g., at least one of Ti, Au, Sn, Ni, Cr, Ga, In, Bi, Cu, Ag, and Ta.

The reflective layer 160 may be disposed on the adhesion layer 170. The reflective layer 160 may reflect light incident from the light emitting structure 135 to improve light extraction efficiency.

For example, the reflective layer 160 may be formed of a metal or alloy containing at least one of Ag, Ni, Al, Rh, Pd, Ir, Ru, Mg, Zn, Pt, Au, and Hf. Also, the reflective layer 160 may have a multi-layered structure and be formed of one of the metals or alloys and light-transmitting conductive materials such as IZO, IZTO, IAZO, IGZO, IGTO, AZO, and ATO. For example, the reflective layer 160 may have a stacked structure of IZO/Ni, AZO/Ag, IZO/Ag/Ni, or AZO/Ag/Ni.

Although the top surface of the reflective layer 160 contacts the ohmic contact layer 150 in the current embodiment, the reflective layer 160 may contact the protection layer 140, a current blocking layer 145, or the light emitting structure layer 135. According to another embodiment, at least one of the ohmic contact layer 150, the current blocking layer 145, and the reflective layer 160 may not be provided. The reflective layer 160, the ohmic contact layer 150, the protection layer 140, and the current blocking layer 145 may be variously modified and designed in area, structure, and shape.

The ohmic contact layer 150 may be disposed on the reflective layer 160. The ohmic contact layer 150 may ohmic-contact the second conductive type semiconductor layer 130 to smoothly supply a power to the light emitting structure layer 135. The ohmic contact layer 150 may be formed of at least one of ITO, IZO, IZTO, IAZO, IGZO, IGTO, AZO, and ATO.

That is, the ohmic contact layer 150 may selectively use a light-transmitting conductive layer and a metal. Also, the ohmic contact layer 150 may have a single- or multi-layered structure. The ohmic contact layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, Ni, Ag, and Ni/IrOx/Au/ITO.

Although the ohmic contact layer 150 contacts bottom and side surfaces of the current blocking layer 145 in the current embodiment, the ohmic contact layer 150 may be spaced from the current blocking layer 145 or contact only the side surface of the current blocking layer 145.

The current blocking layer (CBL) 145 may be disposed between the ohmic contact layer 145 and the second conductive type semiconductor layer 130. The top surface of the current blocking layer 145 contacts the second conductive type semiconductor layer 130, and the bottom and side surfaces of the current blocking layer 145 contacts the ohmic contact layer 150.

At least portion of the current blocking layer 145 vertically overlaps the electrode 115. Thus, the current blocking layer 145 may prevent a current from concentrately flowing into the shortest distance between the conductive support substrate 175 and the electrode 115 to improve the light efficiency of the light emitting device 100.

The current blocking layer 145 may be formed of a material having conductivity less than that of the reflective layer 160 or the ohmic contact layer 150, a material having low conductivity, or a material, which schottky-contacts a second conductive type semiconductor layer 130. For example, the current blocking layer 145 may be formed of at least one of ITO, IZO, IZTO, IAZO, IGZO, IGTO, AZO, ATO, ZnO, $SiO_2$, $SiO_2$, $SiO_x$, $SiO_xN_y$, $Si_3N_4$, $Al_2O_3$, $TiO_x$, Ti, Al, and Cr.

The protection layer 140 may be disposed in a circumference region of a top surface of the adhesion layer 170. That is, the protection layer 140 may be disposed in a circumference region between the light emitting structure layer 135 and the adhesion layer 170. Also, the protection layer 140 may be formed of an insulation material such as ZnO or $SiO_2$. A portion of the protection layer 140 may be disposed between the conductive support substrate 175 and the light emitting structure layer 135 to vertically overlap the light emitting structure layer 135.

The protection layer 140 increases a distance of a side surface between the adhesion layer 170 and the active layer 120. Thus, the protection layer 140 may prevent the adhesion layer 170 and the active layer 120 from being electrically short-circuited to each other.

Also, when an isolation etching process is performed on the protection layer 140 to separate the light emitting structure layer 145 into unit chips in a chip separation process, fragments may be generated from the adhesion layer 170. As a result, the fragments are attached between the second conductive type semiconductor layer 130 and the active layer 120 or between the active layer 120 and the first conductive type semiconductor layer 110 to prevent them from being electrically short-circuited to each other. The protection layer 140 may be formed of a material, which is not broken or does not generate fragments or a material, which does not cause an electric short-circuit even though it is broken somewhat or generates a small amount of fragments.

The light emitting structure layer 135 may be disposed on the ohmic contact layer 150 and the protection layer 140.

An inclined surface may be formed on a side surface of the light emitting structure layer 135 in the isolation etching process for dividing the light emitting structure 135 into unit chips. A portion of the inclined surface vertically overlaps the protection layer 140.

A portion of the top surface of the protection layer 140 may be exposed by the isolation etching process. Thus, a portion region of the protection layer 140 vertically overlaps the light emitting structure layer 135, and the other region of the protection layer 140 does not vertically overlap the light emitting structure layer 135.

The light emitting structure layer 135 may be formed of a plurality of Group III-V compound semiconductor layers. For example, the light emitting structure layer 135 may include the first conductive type semiconductor layer, the active layer 120 under the first conductive type semiconductor layer 110, and the second conductive type semiconductor layer 130 under 110 the active layer 120.

For example, the first conductive type semiconductor layer 110 may be realized as an N-type semiconductor layer. The N-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, AlInN, InGaN, AlN, and InN. The N-type semiconductor layer may be doped with an N-type dopant such as Si, Ge, or Sn. The first conductive type semiconductor layer 110 may be a single- or multi-layered structure, but is not limited thereto.

The active layer 120 is disposed under the first conductive type semiconductor layer 110. The active layer 120 have one of a single quantum well structure, a multi quantum well (MQW) structure, a quantum wire structure, and a quantum dot structure. The active layer 120 may be formed of a semiconductor material having a compositional formula of $In_xAl_yGa_{1-x-y}N$ ($0 \leq x \leq 1$, $0 \leq y \leq 1$, $0 \leq x+y \leq 1$). When the active layer 120 has the multi quantum well structure, the active layer 120 may have a structure in which a plurality of well layers and a plurality of barrier layers are stacked, e.g., a cycle of an InGaN well layer/GaN barrier layer.

A clad layer (not shown), which is doped with an N-type or P-type dopant, may be disposed on and/or under the active layer 120. The clad (not shown) may be realized as an AlGaN layer or an InAlGaN layer.

The second conductive type semiconductor layer 130 may be disposed under the active layer 120. For example, the second conductive type semiconductor layer 130 may be realized as a P-type semiconductor layer. The P-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlInN, AlN, and InN. The P-type semiconductor layer may be doped with a P-type dopant such as Mg, Zn, Ca, Sr, or Ba.

The second conductive type semiconductor layer 130 may have a single- or multi-layered structure, but is not limited thereto.

Unlike the above-described light emitting structure layer 135, the first conductive type semiconductor layer 110 may include a P-type semiconductor layer, and the second conductive type semiconductor layer 130 may include an N-type semiconductor layer. Also, a third conductive type semiconductor layer (not shown) including the N- or P-type semiconductor layer may be disposed under the second conductive type semiconductor layer 130. Thus, the light emitting structure layer 135 may have at least one of an N-P junction structure, a P-N junction structure, an N-P-N junction structure, and a P-N-P junction structure. Also, the conductive type dopant may be uniformly or non-uniformly distributed within the first conductive type semiconductor layer 110 and the second conductive type semiconductor layer 130. That is, the light emitting structure layer 135 may have various structures, but is not limited thereto.

The electrode 115 is disposed on the light emitting structure layer 135. The electrode 115 may include a pad at which wire bonding is performed and a branch extending from the pad. The branch may be branched in a predetermined pattern shape and have various shapes.

A roughness pattern 112 for improving the light extraction efficiency may be disposed on a top surface of the first conductive type semiconductor layer 110. Thus, a roughness pattern may be disposed also on a top surface of the electrode 115, but is not limited thereto.

A passivation layer 180 may be disposed on at least side surface of the light emitting structure layer 135. Also, the passivation layer 180 may be disposed on the top surfaces of the first conductive type semiconductor layer 110 and the protection layer 140, but is not limited thereto.

The passivation layer 180 may be configured to electrically protect the light emitting structure layer 135.

In the light emitting device according to the current embodiment, an inclined surface 141 may be disposed on at least portion of the top surface of the protection layer 140. Also, an inclined surface 181 may be disposed on a top surface of the passivation layer 180 along the inclined surface 141 of the protection layer 140. The inclined surface 141 disposed on the top surface of the protection layer 140 contacts the passivation layer 180. The passivation layer 180 may be formed of a material different from that of the protection layer 140.

Since the inclined surface 141 is disposed on the top surface of the protection layer 140, the top surface of the protection layer 140 may have a height or thickness gradually decreasing toward the outside. Also, since the inclined surface 181 is disposed on the top surface of the passivation layer 180, the top surface of the passivation layer 180 may have a height gradually decreasing toward the outside and a uniform thickness.

In the current embodiment, the protection layer 140 may have the flat top surface at a portion vertically overlapping the light emitting structure layer 135. Also, the protection layer 140 may have the inclined surface 141 at a portion, which does not overlap the light emitting structure layer 135, i.e., at a portion exposed by removing the light emitting structure layer 135. Here, the light emitting structure layer 135 may be grown according to a method of manufacturing the light emitting device (that will be described later) to form the inclined surface 141. This will be described below in detail. Similarly, the inclined surface 181 disposed on the passivation layer 180 will be described below in detail.

Hereinafter, a method of manufacturing the light emitting device will be described in detail. The explanations duplicated with the aforementioned embodiment will be omitted.

FIGS. 2 to 11 are views illustrating a process for fabricating the light emitting device according to an embodiment.

Figure 2:
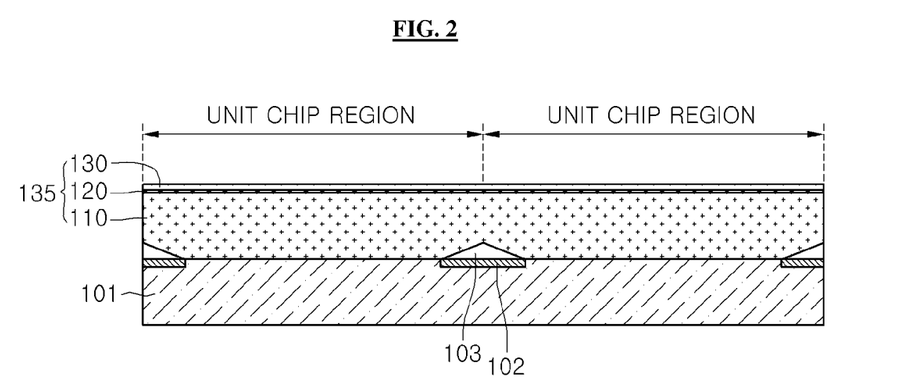
FIGS. 2 to 11 are views illustrating a process of manufacturing a light emitting device according to an embodiment.

Referring to FIG. 2, a growth substrate 101 is prepared. For example, the growth substrate 101 may be formed of at least one of sapphire ($Al_2O_3$), SiC, GaAs, GaN, ZnO, Si, GaP, InP, Ge, and Ga2O3, but is not limited thereto.

A mask layer 102 is formed on the growth substrate 101 at a boundary portion of a unit chip region. A light emitting structure layer 135 is formed on the growth substrate 101 including the mask layer 102.

The mask layer 102 may be formed as described in FIGS. 13 to 15. Alternatively, as shown in FIG. 14, a space 103 may be formed on the mask layer 102.

The growth substrate 101 may be selectively removed to form an etch concave portion. Then, a material such as $SiO_2$ in which a light emitting structure layer 135 is not grown may be filled into the etch concave portion to form the mask layer 102. The mask layer 102 may completely fill the etch concave portion or partially fill the etch concave portion. The light emitting structure layer 135 may be vertically and horizontally grown on the growth substrate 101 adjacent to the mask layer 102 to meet each other on the mask layer 102 while forming the space 103.

A first conductive type semiconductor layer 110, an active layer 120, and a second conductive type semiconductor layer 130 may be grown on the growth substrate 101 to form the light emitting structure layer 135.

For example, the light emitting structure layer 135 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

A buffer layer (not shown) and/or an undoped nitride layer (not shown) may be further disposed between the light emitting structure layer 135 and the growth substrate 101 to reduce lattice mismatch due to a lattice constant difference between the light emitting structure layer 135 and the growth substrate 101.

Figure 3:
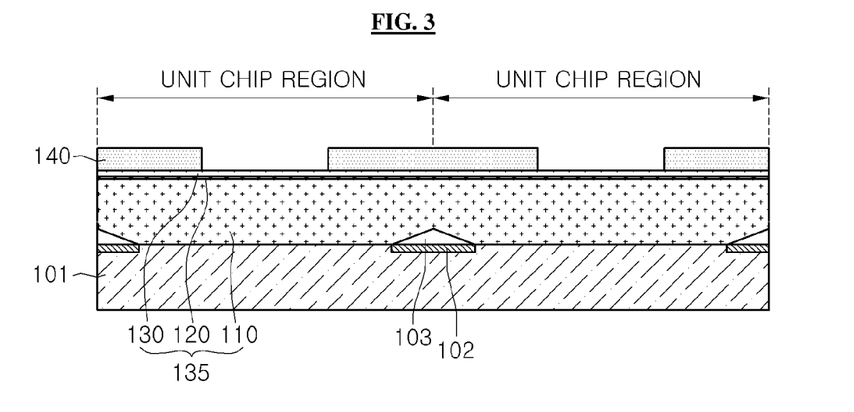

Referring to FIG. 3, a protection layer 140 is selectively formed corresponding to a unit chip region on the light emitting structure layer 135.

The protection layer 140 may be formed around the unit chip region using a mask pattern. The protection layer 140 may be formed using various deposition processes such as a sputtering process.

Figure 4:
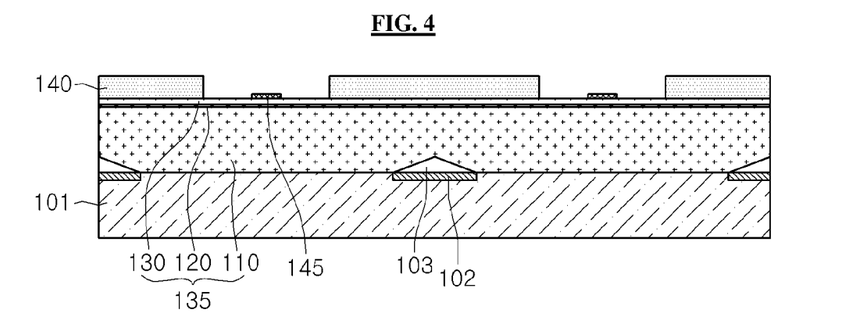

Referring to FIG. 4, a current blocking layer 145 may be formed on a second conductive type semiconductor layer 130. The current blocking layer 145 may be formed using the mask pattern.

The protection layer 140 and the current blocking layer 145 may be formed of the same material as each other. The protection layer 140 and the current blocking layer 145 may be formed using one process at the same time without performing separate processes. For example, a SiO2 layer may be formed on the second conductive type semiconductor layer 130, and then, the protection 140 and the current blocking layer 145 may be formed using the mask pattern at the same time.

Figure 5:
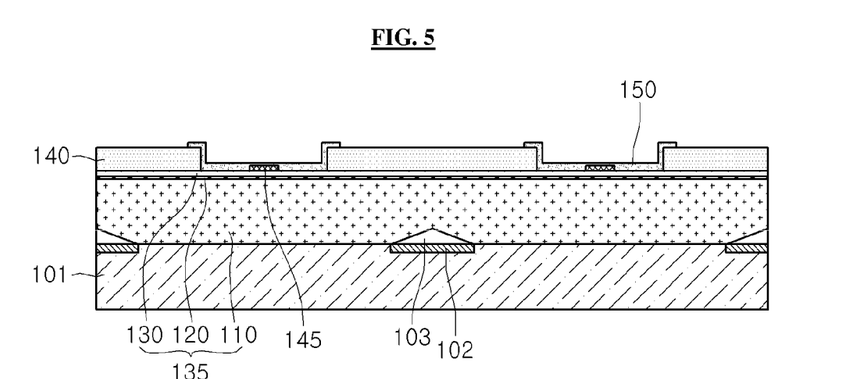
Figure 6:
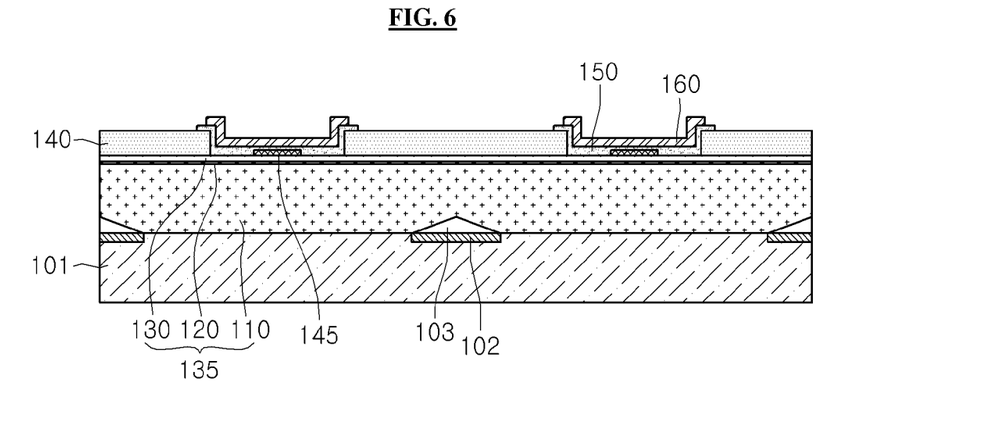

Referring to FIGS. 5 and 6, an ohmic contact layer 150 may be formed on the second conductive type semiconductor layer 130 and the current blocking layer 145. A reflective layer 160 may be formed on the ohmic contact layer 150.

For example, the ohmic layer 150 and the reflective layer 160 may be formed using one an E-beam deposition process, a sputtering process, and a plasma enhanced chemical vapor deposition (PECVD) process.

Figure 7:
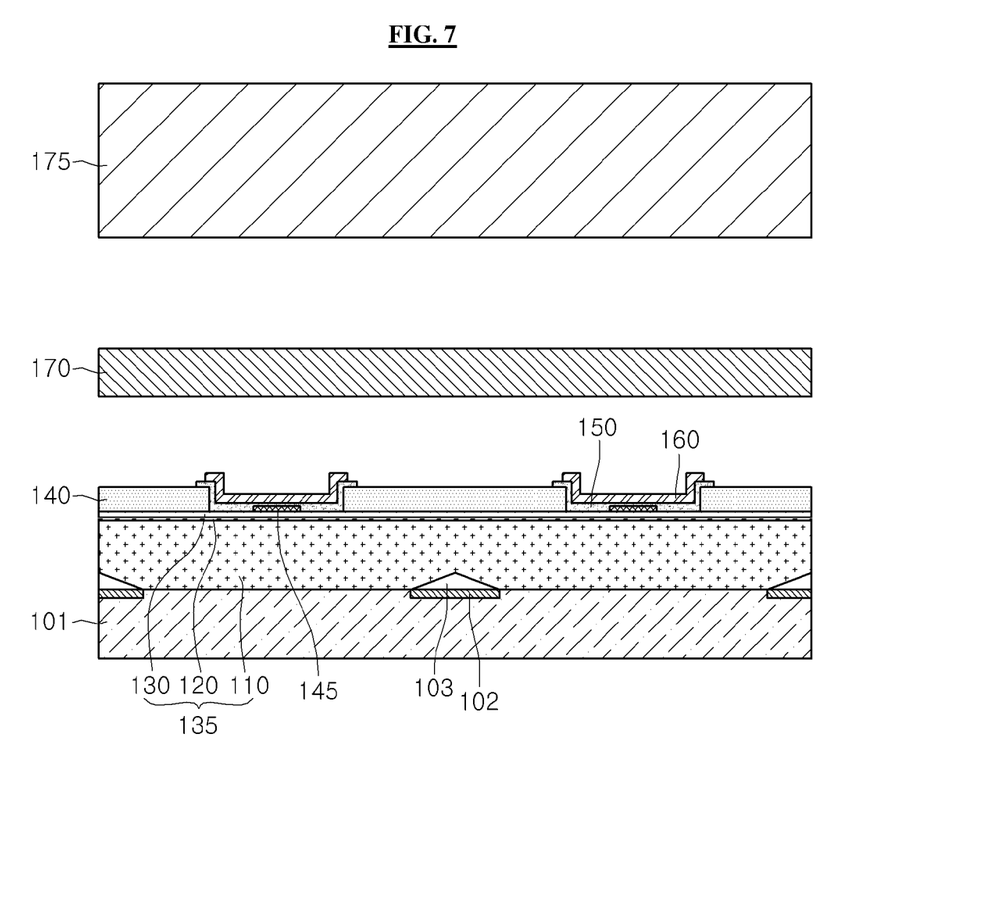
Figure 8:
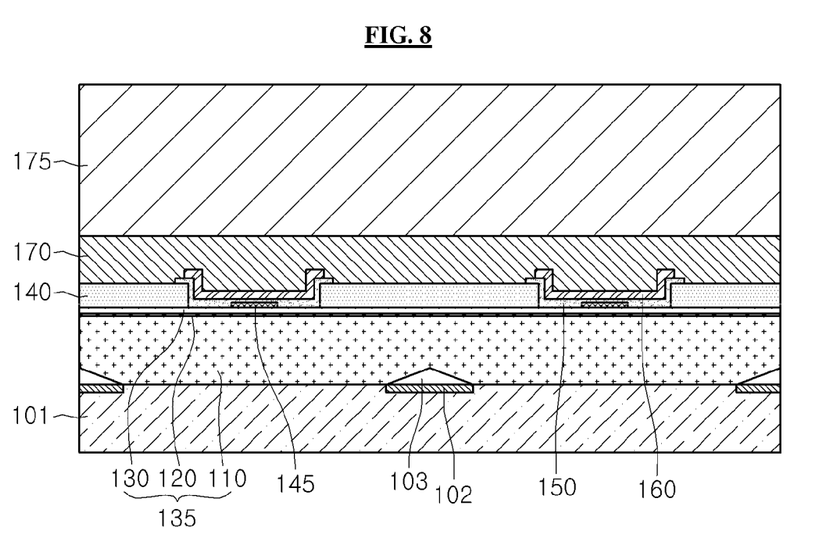

Referring to FIGS. 7 and 8, a conductive support substrate 175 is prepared.

The conductive support member 175 is adhered to the structure illustrated in FIG. 6 using the adhesion layer 170 as a medium.

The adhesion layer 170 may contact the reflective layer 160, an end of the ohmic contact layer 150, and the protection layer 140 to enhance an adhesion between the layers.

The conductive support substrate 175 may be attached by the adhesion layer 170. Although the conductive support substrate 175 is coupled through the adhesion layer 170 using a bonding process in the current embodiment, the conductive support substrate 175 may be formed using a plating or deposition process.

Figure 9:
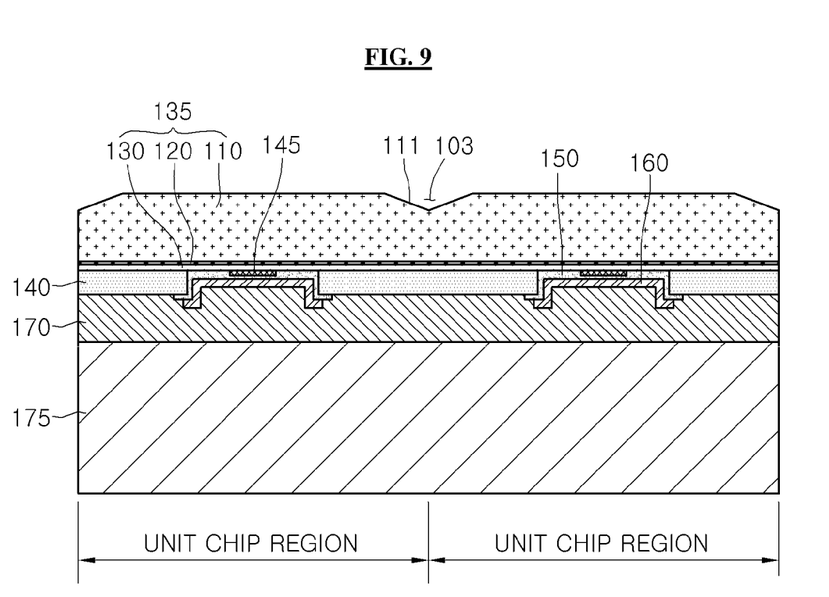

Referring to FIG. 9, the growth substrate 101 is removed from the light emitting structure layer 135. FIG. 9 illustrates a structure in which the structure of FIG. 8 turns upside down.

The growth substrate 101 may be removed by a laser lift off (LLO) process or a chemical lift off (CLO) process.

For example, as shown in FIG. 17, the growth substrate 101 and the mask layer 102 may be removed through the laser lift off process. Here, a stress of the light emitting structure layer 135 applied in the laser lift off process may be reduced.

When the growth substrate 101 and the mask layer 102 are removed, a space 103 and an inclined surface 111 facing the space 103 are exposed on the first conductive type semiconductor layer 110.

Figure 10:
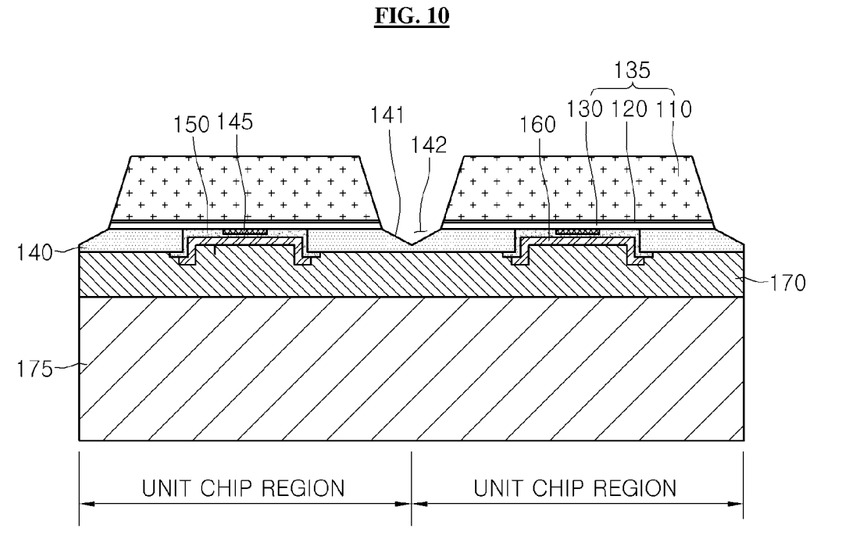

Referring to FIG. 10, an isolation etching process is performed on the light emitting structure layer 135 along a unit chip region to separate the light emitting structure 135 into a plurality of light emitting structure layers 135. For example, the isolation etching process may be performed by a dry etch process such as an inductively coupled plasma (ICP) process.

The isolation etching process is performed after the mask pattern is formed on the light emitting structure layer 135. The light emitting structure layer 135 and the protection layer 140 are etched in a shape equal to those of the space 103 and the inclined surface 111.

Thus, the space 142 and the inclined surface 141 are formed on the protection layer 140.

Figure 11:
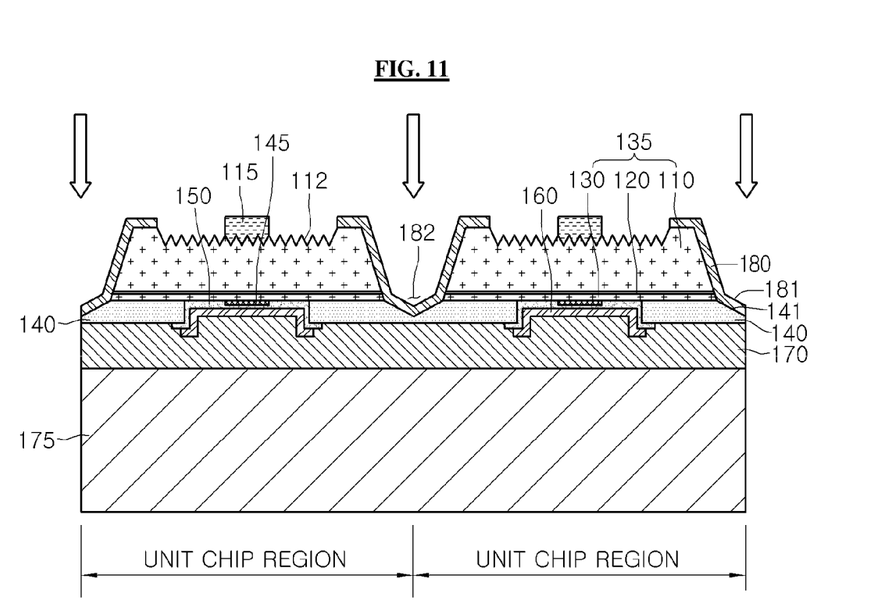

Referring to FIG. 11, a passivation layer 180 is formed on the protection layer 140 and the light emitting structure layer 135. The passivation layer 180 is selectively removed to expose the top surface of the first conductive type semiconductor layer 110.

Since the passivation layer 180 is formed on the space 142 and the inclined surface 141 of the protection layer 140, a space 182 and an inclined surface 181 are formed also on the passivation layer 180.

A roughness pattern 112 for improving the light extraction efficiency is disposed on the top surface of the first conductive type semiconductor layer 110. An electrode 115 is formed on the roughness pattern 112. The roughness pattern 112 may be formed by a wet etch process or a dry etch process.

When the structure is separated into unit chip regions through the chip separation process, a plurality of light emitting devices may be manufactured.

For example, the chip separation process may include a breaking process in which a physical force is applied using a blade to separate the chip, a laser scribing process in which a laser is irradiated in a chip boundary region to separate the chip, and an etch process including a wet or dry etch process, but is not limited thereto.

Thus, the light emitting device illustrated in FIG. 1 may be manufactured.

Figure 12:
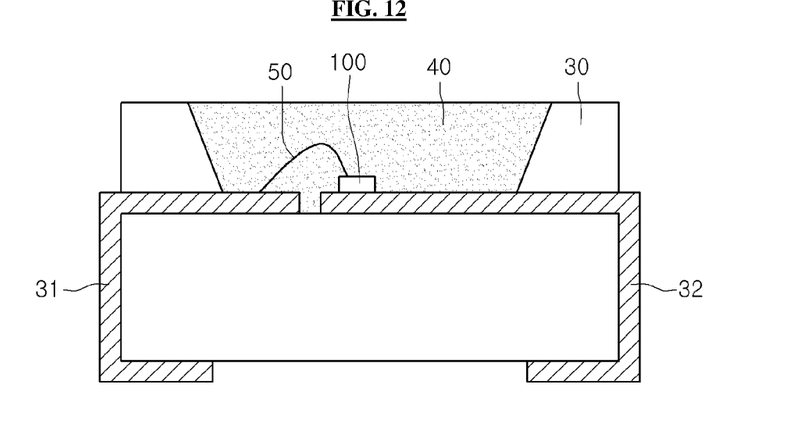
FIG. 12 is a sectional view of a light emitting device package including a light emitting device according to an embodiment.

FIG. 12 is a sectional view of a light emitting device package including a light emitting device according to an embodiment.

Referring to FIG. 12, a light emitting device package according to an embodiment includes a package body 30, first and second electrode layers 31 and 32 disposed on the package body 30, a light emitting device 100 disposed on the package body 30 and electrically connected to the first and second electrode layers 31 and 32, and a molding member 40 surrounding the light emitting device 100 on the body 30.

The package body 30 may be formed of a silicon material, a synthetic resin material, or a metal material. The package body 30 may have a cavity having an inclined side surface.

The first electrode layer 31 and the second electrode layer 32 may be electrically separated from each other and provide a power to the light emitting device 100. Also, the first and second electrode layers 31 and 32 may reflect light generated in the light emitting device 100 to improve light efficiency. In addition, the first and second electrode layers 31 and 32 may discharge heat generated in the light emitting device 100 to the outside.

The light emitting device 100 may be disposed on the package body 30 or the first or second electrode layer 31 or 32. Here, the light emitting device 100 equal to that described in FIG. 1 is installed.

The light emitting device 100 may be electrically connected to the first and second electrode layers 31 and 32 using one of a wire method, a flip-chip method, and a die bonding method. In the current embodiment, the light emitting device 100 is electrically connected to the first electrode layer 31 through a wire 50. Also, the light emitting device 100 directly contacts the second electrode layer 32 and is electrically connected to the second electrode layer 32.

The molding member 40 may surround the light emitting device 100 to protect the light emitting device 100. Also, a phosphor may be contained in the molding member 40 to change a wavelength of light emitted from the light emitting device 100.

A plurality of light emitting device packages according to the embodiments may be arrayed on a substrate. Optical members such as a light guide plate, a prism sheet, a diffusion sheet, and a fluorescence sheet may be disposed on a path of light emitted from the light emitting device package. The light emitting device package, the substrate and the optical members may function as a backlight unit or lighting unit. For example, the lighting system may include a backlight unit, a lighting unit, an indicator unit, a lamp, a streetlamp, etc.

Figure 18:
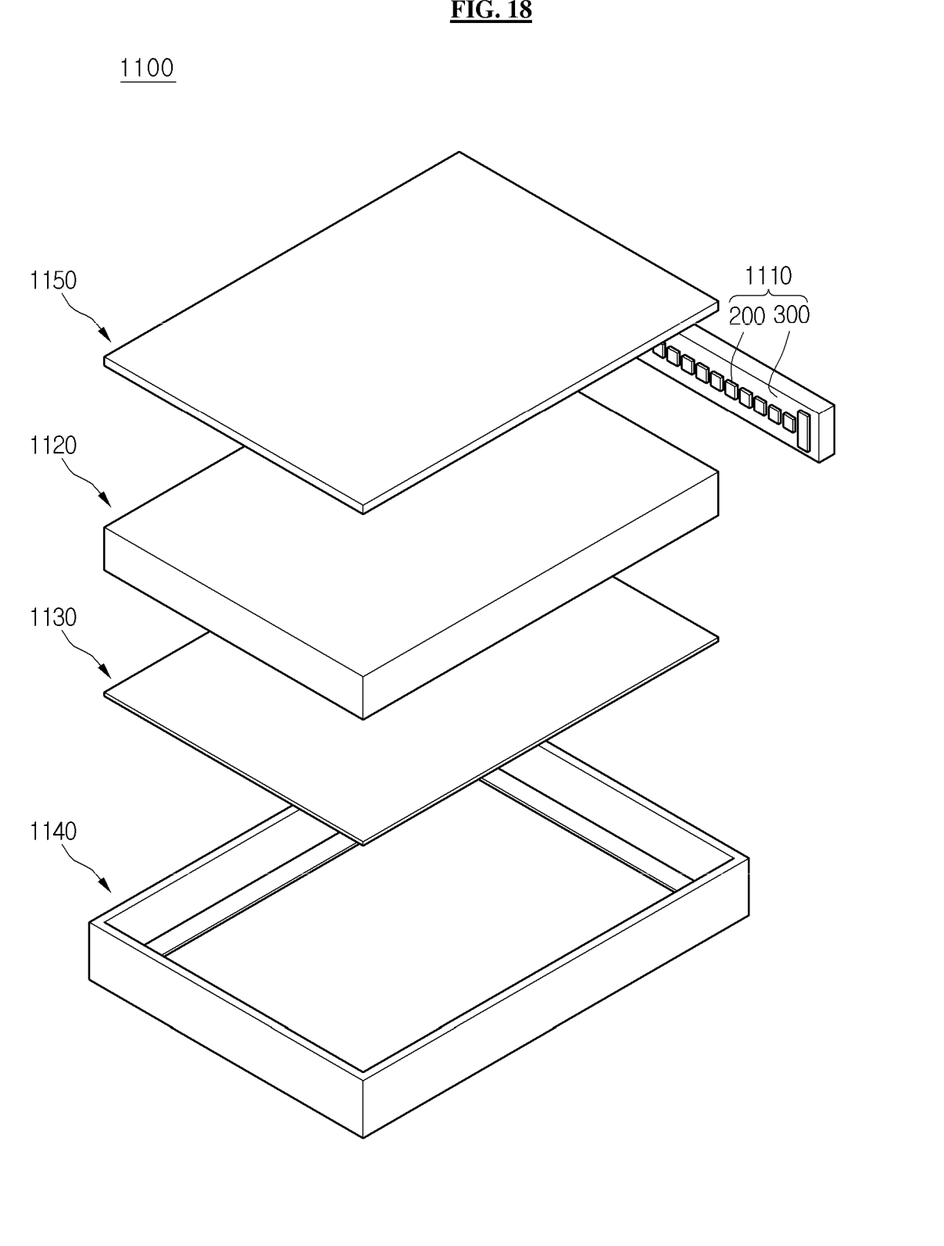
FIG. 18 is a view of a backlight unit including a light emitting device and a light emitting device package according to an embodiment.

FIG. 18 is a view of a backlight unit including a light emitting device and a light emitting device package according to an embodiment. The backlight unit 1100 of FIG. 18 is an example of a lighting system, but is not limited thereto.

Referring to FIG. 18, the backlight unit 1100 may include a bottom frame 1400, a light guide member 1120 disposed within the bottom frame 1140, and a light emitting module 1110 disposed on at least one surface or an under surface of the light guide member 1120. Also, a reflective sheet 1130 may be disposed under the light guide member 1120.

The bottom frame 1140 may have an upwardly opened box shape to receive the light guide member 1120, the light emitting module 1110, and the reflective sheet 1130. Also, the bottom frame 1140 may be formed of a metal material or a resin material, but is not limited thereto.

The light emitting module 1110 may include a substrate 300 and a plurality of light emitting device packages mounted on the substrate 300. The plurality of light emitting device packages 200 may provide light to the light guide member 1120.

As shown in FIG. 18, the light emitting module 1110 may be disposed on at least one surface of inner side surfaces of the bottom frame 1140, and thus, the light emitting module 1110 may provide light toward at least one side surface of the light guide member 1120.

Alternatively, the light emitting module 1110 may be disposed on an under surface of the bottom frame 1140 to provide light toward an under surface of the light guide member 1120. This may be variously varied according to a design of the BLU, but is not limited thereto.

The light guide member 1120 may be disposed inside the bottom frame 1140. The light guide member 1120 may receive the light provided from the light emitting module 1110 to produce planar light, and then guide the planar light to a liquid crystal panel (not shown).

For example, the light guide member 1120 may be a light guide panel (LGP). The light guide plate may be formed of one of a resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed on the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. Also, the fluorescence sheet may be a light-transmitting plate or film containing a phosphor.

The reflective sheet 1130 may be disposed under the light guide member 1120. The reflective sheet 1130 may reflects the light emitted through the under surface of the light guide member 1120 toward a light emitting surface of the light guide member 1120.

The reflective sheet 1130 may be formed of a material having superior reflectance, e.g., a PET resin, a PC resin, or a PVC resin, but is not limited thereto.

Figure 19:
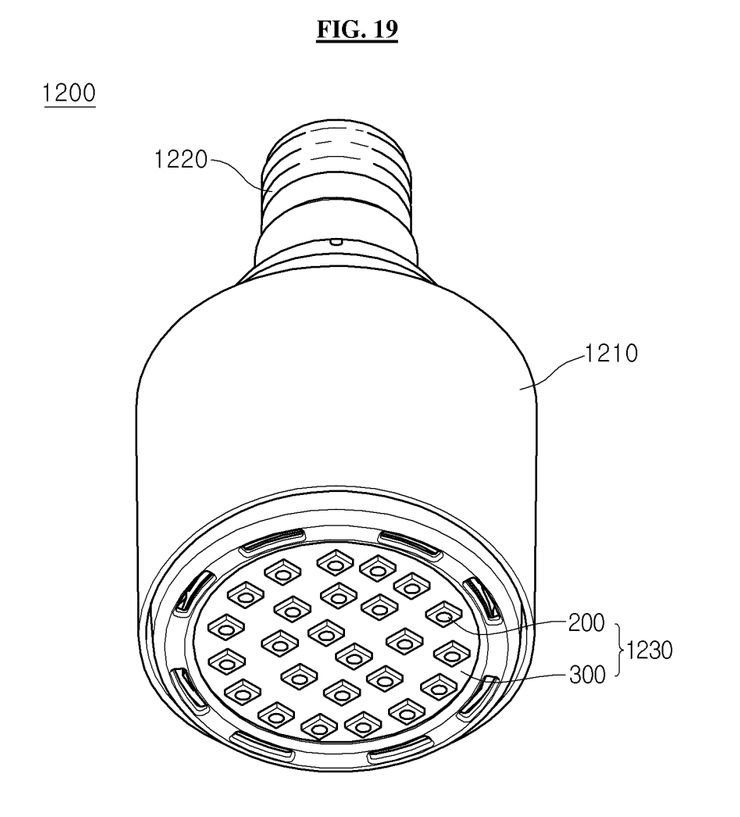
FIG. 19 is a perspective view of a lighting unit including a light emitting device and a light emitting device package according to embodiments.

FIG. 19 is a perspective view of a lighting unit including a light emitting device and a light emitting device package according to embodiments. However, a lighting unit 1200 of FIG. 19 is an example of the lighting system, but is not limited thereto.

Referring to FIG. 19, the lighting unit 1200 may include a case body 1210, a light emitting module 1230 disposed on the case body 1210, a connection terminal 1220 disposed on the case body 1210 to receive a power from an external power source.

The case body 1210 may be formed of a material having good thermal dissipation properties, e.g., a metal material or a resin material.

The light emitting module 1230 may include a substrate 300 and at least one light emitting device package 200 mounted on the substrate 300.

A circuit pattern may be printed on a dielectric to form the substrate 300. For example, the substrate 300 may include a printed circuit board (PCB), a metal core PCB, a flexible PCB, and a ceramic PCB.

Also, the substrate 300 may be formed of an effectively reflective material or have a color on which light is effectively reflected from a surface thereof, e.g., a white color or a silver color.

At least one light emitting device package 200 may be mounted on the substrate 300. The light emitting device package 200 may include at least one light emitting device according to the embodiments. The light emitting device may be a light emitting diode (LED). The LED may include colored LEDs, which respectively emit light having a red color, a green color, a blue color, and a white color and an ultraviolet (UV) LED emitting UV rays.

The light emitting module 1230 may have various combinations of the LED to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet changes a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. Referring to FIG. 19, the connected terminal 1120 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

As described above, in the lighting unit, at least one of a light guide member, a diffusion sheet, a light collection sheet, a brightness enhancement sheet, and a fluorescence sheet may be disposed on a path of light emitted from the light emitting module to obtain desired optical effects.

As described above, the lighting system according to the embodiments may have superior optical characteristics because it includes the light emitting device or the light emitting device package according to the embodiments.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
 a conductive support substrate;
 a protection layer on the conductive support substrate;
 a light emitting structure layer comprising a first conductive type semiconductor layer, a second conductive type semiconductor layer under the first conductive type semiconductor layer, and an active layer between the first conductive type semiconductor layer and the second conductive type semiconductor layer on the conductive support substrate and the protection layer;
 a reflective layer between the light emitting structure layer and the conductive support substrate; and
 an electrode on the light emitting structure layer,
 wherein the protection layer includes a first portion between the second conductive type semiconductor layer and the conductive support substrate, and a second portion having an inclined top surface with respect to a top surface of the first portion,
 wherein the second portion of the protection layer is outwardly disposed from an outer wall of the light emitting structure layer, wherein an outer portion of the inclined top surface of the second portion of the protection layer is spaced apart from the outer wall of the light emitting structure layer.

2. The light emitting device of claim 1, further comprising a passivation layer disposed on the outer wall of the light emitting structure layer and disposed on the inclined top surface of the second portion of the protection layer.

3. The light emitting device of claim 1, wherein the first portion of the protection layer has a flat top surface and is vertically overlapped with a peripheral portion of a bottom surface of the light emitting structure layer.

4. The light emitting device of claim 2, wherein the inclined top surface of the second portion of the protection layer directly contacts the passivation layer and the second portion of the protection layer is located at a lower position than a bottom surface of the light emitting structure layer.

5. The light emitting device of claim 2, wherein the passivation layer has an inclined lower surface vertically overlapping the inclined top surface of the second portion of the protection layer.

6. The light emitting device of claim 1, wherein the second portion of the protection layer has a thickness gradually decreasing in a direction toward a side surface of the conductive support substrate.

7. The light emitting device of claim 1, further comprising an adhesion layer between the conductive support substrate and the reflective layer, and an ohmic contact layer between the reflective layer and the light emitting structure layer.

8. The light emitting device of claim 7, further comprising a current blocking layer between the ohmic contact layer and the light emitting structure layer.

9. The light emitting device of claim 7, wherein a lower surface of the protection layer is disposed on the adhesion layer.

10. The light emitting device of claim 9, wherein the top surface of the first portion of the protection layer contacts a lower surface of the second conductive type semiconductor layer, and the lower surface of the protection layer directly contacts the adhesion layer.

11. The light emitting device of claim 1, wherein the protection layer is formed of an insulation material.

12. The light emitting device of claim 11, wherein the protection layer is formed of ZnO or SiO$_2$.

13. The light emitting device of claim 2, wherein the passivation layer is formed of a material different from that of the protection layer.

14. A light emitting device package comprising:
a package body;
a first electrode layer and a second electrode layer on the package body; and
a light emitting device electrically connected to the first and second electrode layers,
wherein the light emitting device comprises: a conductive support substrate; a protection layer on the conductive support substrate; a light emitting structure layer comprising a first conductive type semiconductor layer, a second conductive type semiconductor layer under the first conductive type semiconductor layer, and an active layer between the first conductive type semiconductor layer and the second conductive type semiconductor layer on the conductive support substrate and the protection layer; a reflective layer between the light emitting structure layer and the conductive support substrate; and an electrode on the light emitting structure layer,
wherein the protection layer includes a first portion between the second conductive type semiconductor layer and the conductive support substrate and a second portion having an inclined top surface with respect to a top surface of the first portion,
wherein the second portion of the protection layer is outwardly disposed from an outer wall of the light emitting structure layer,
wherein an outer portion of the inclined top surface of the second portion of the protection layer is spaced apart from the outer wall of the light emitting structure layer.

15. The light emitting device package of claim 14, further comprising a passivation layer disposed on the outer wall of the light emitting structure layer and disposed on the inclined top surface of second portion of the protection layer, an adhesion layer between the conductive support substrate and the reflective layer, and an ohmic contact layer between the reflective layer and the light emitting structure layer.

16. The light emitting device package of claim 14, wherein the first portion of the protection layer has a flat top surface and is vertically overlapped with a peripheral portion of a bottom surface of the light emitting structure layer,
wherein the second portion of the protection layer has a thickness gradually decreasing in a direction toward a side surface of the conductive support substrate.

17. The light emitting device package of claim 15, wherein the inclined top surface of the second portion of the protection layer directly contacts the passivation layer,
wherein the passivation layer has an inclined lower surface at a portion vertically overlapping the inclined top surface of the second portion of the protection layer.

18. A light emitting device comprising:
a conductive support substrate;
a light emitting structure layer on the conductive support substrate, the light emitting structure layer comprising a first conductive type semiconductor layer, a second conductive type semiconductor layer under the first conductive semiconductor layer, and an active layer between the first conductive type semiconductor layer and the second conductive type semiconductor layer;
a protection layer including a first portion between the second conductive type semiconductor layer and the conductive support substrate, and a second portion outwardly disposed beyond an outer wall of the light emitting structure layer;
a passivation layer on the outer wall of the light emitting structure layer;
a reflective layer between the light emitting structure layer and the conductive support substrate; and
an electrode on the light emitting structure layer,
wherein the second portion of the protection layer is located at a lower position than a bottom surface of the light emitting structure layer and has an inclined top surface under the passivation layer.

19. The light emitting device of claim 18, wherein the protection layer is formed of an insulation material and is disposed on a peripheral portion of the bottom surface of the light emitting structure layer,
wherein the second portion of the protection layer has a thickness thinner than that of the first portion of the protection layer.

20. The light emitting device of claim 18, wherein the passivation layer is disposed on the outer wall of the light emitting structure layer and is directly contacted with the inclined top surface of the second portion of the protection layer.

* * * * *